(12) United States Patent
Shen

(10) Patent No.: US 8,337,048 B2
(45) Date of Patent: Dec. 25, 2012

(54) LIGHT SOURCE PACKAGE HAVING A SIX SIDED LIGHT EMITTING DIE SUPPORTED BY ELECTRODES

(76) Inventor: Yu-Nung Shen, Taipei (TW)

( * ) Notice: Subject to any disclaimer, the term of this patent is extended or adjusted under 35 U.S.C. 154(b) by 345 days.

(21) Appl. No.: 12/628,614

(22) Filed: Dec. 1, 2009

(65) Prior Publication Data

US 2010/0109551 A1    May 6, 2010

Related U.S. Application Data

(63) Continuation-in-part of application No. 11/932,687, filed on Oct. 31, 2007, now Pat. No. 7,682,053.

(51) Int. Cl.
*F21V 29/00* (2006.01)
(52) U.S. Cl. ............ 362/267; 257/98; 362/294; 362/373
(58) Field of Classification Search .................. 362/294, 362/373, 249.02, 267; 313/317, 318.01, 313/318.03, 318.04, 318.11, 318.12, 512; 257/98
See application file for complete search history.

(56) References Cited

U.S. PATENT DOCUMENTS

| | | | | | |
|---|---|---|---|---|---|
| 4,727,289 | A | * | 2/1988 | Uchida | 315/71 |
| 5,266,946 | A | * | 11/1993 | Rydel | 340/12.22 |
| 6,220,722 | B1 | * | 4/2001 | Begemann | 362/231 |
| 6,523,978 | B1 | * | 2/2003 | Huang | 362/249.04 |
| 7,011,432 | B2 | * | 3/2006 | Chen et al. | 362/256 |
| 7,976,182 | B2 | * | 7/2011 | Ribarich | 362/221 |
| 7,997,750 | B2 | * | 8/2011 | Chiang | 362/101 |

* cited by examiner

*Primary Examiner* — Robert May
(74) *Attorney, Agent, or Firm* — Jackson IPG PLLC

(57) ABSTRACT

A light source package includes a metal base adapted for engaging a suitable electrical socket; a transparent housing assembled with the base so as to form together with the base an accommodating space; and a light-emitting unit mounted within the accommodating space. The light-emitting unit has an LED die, and the LED die is operatively disposed in the accommodating space such that the light emitted from all of the six surfaces of the LED die is completely collected for illumination.

8 Claims, 6 Drawing Sheets

LIGHT SOURCE PACKAGE HAVING A SIX SIDED LIGHT EMITTING DIE SUPPORTED BY ELECTRODES

CROSS-REFERENCE TO RELATED APPLICATION

This application is a continuation-in-part of U.S. Ser. No. 11/932,687 filed on Oct. 31, 2007 now U.S. Pat. No. 7,682,053, the disclosure of which is incorporated herein by reference in its entirety.

BACKGROUND OF THE INVENTION

1. Field of the Invention

The present invention relates to a light source package.

2. Description of the Prior Art

Referred to as a cold light source, light emitting diode (LED) lamps differ from conventional heat-generating incandescent lamps in that they are activated to generate light by applying electric current to light-emitting material. As LEDs have been found to have advantages of being highly durable, light weighted and free of toxic materials, such as mercury, and having a long lifespan and low power consumption, solid-state lighting using LEDs has become the focus of considerable research in the lighting industry and semiconductor industry worldwide.

FIG. 1 shows a traditional tungsten-filament bulb B, which includes a metal base B1 adapted for threadedly engaging an E27-type socket (not shown), a transparent housing B2 assembled with the metal base B1 so as to form together with the base 1 an accommodating space B20, a set of contact wires B3 disposed within the accommodating space B20 and fixed on the base B1, and a tungsten-filament B4 electrically connected to the contact wires B3. When the base B1 is brought into engagement with a socket which has already been electrically connected to a power source, the tungsten-filament B4 emits light for illumination as a result of an electric current passing therethrough. Such a traditional lighting equipment, however, is cost-ineffective and fails to meet the worldwide trend of energy saving and carbon reduction due to its extremely energy-consuming nature and short lifespan.

In view of the above, the inventor has devised a light source package to fulfill the need in this respect.

SUMMARY OF THE INVENTION

Accordingly, an object of the invention is to provide a cost-effective and environmental friendly light source package.

In order to achieve this object, a light source package according to a technical feature of the invention is provided, which comprises a metal base adapted for engaging an electrical socket; a transparent housing assembled with the base so as to form together with the base an accommodating space; and a light-emitting unit mounted within the accommodating space. The light-emitting unit comprises a light-emitting diode die, and the light-emitting diode die has six light-emitting surfaces and is operatively disposed in the accommodating space such that the light emitted from all of the six surfaces of the light-emitting diode die is completely collected for illumination.

According to another technical feature of the invention, a light source package is provided, which comprises a mounting substrate which is a transparent substrate with high thermal conductivity and has a mounting surface overlaid with predetermined circuit traces; a light-emitting diode die mounted on the mounting surface of the mounting substrate and including a first electrode and a second electrode, wherein the first electrode is electrically connected to the circuit traces on the substrate via a first wire; a heat pipe having a through hole, wherein the heat pipe is attached onto the substrate in such a manner that the light-emitting diode die mounted on the substrate is seated within the through hole of the heat pipe, and wherein the second electrode of the light-emitting diode die is connected to the heat pipe via a second wire; and a phosphor layer filled within the through hole of the heat pipe, so as to cover the light-emitting diode die.

According to still another technical feature of the invention, a light source package is provided, which comprises an elongated heat pipe having an end portion; and a plurality of light-emitting diode dies flip-chip mounted on the end portion of the heat pipe.

According to yet another technical feature of the invention, a light source package is provided, which comprises a cup-like casing having a closed bottom portion and an open top portion disposed oppositely to the bottom portion; a heat-dissipating layer formed on an inner surface of the cup-like casing; a thermal conductive layer coated on the heat-dissipating layer; a reflective layer formed on the thermal conductive layer; and a light-emitting unit comprising a mounting substrate located on the reflective layer in an interior of the cup-like casing, an light-emitting diode die flip-chip mounted on the substrate, and a circuit device located on an exterior of the cup-like casing and adapted for controlling power supply to the light-emitting diode die.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Figure 1:
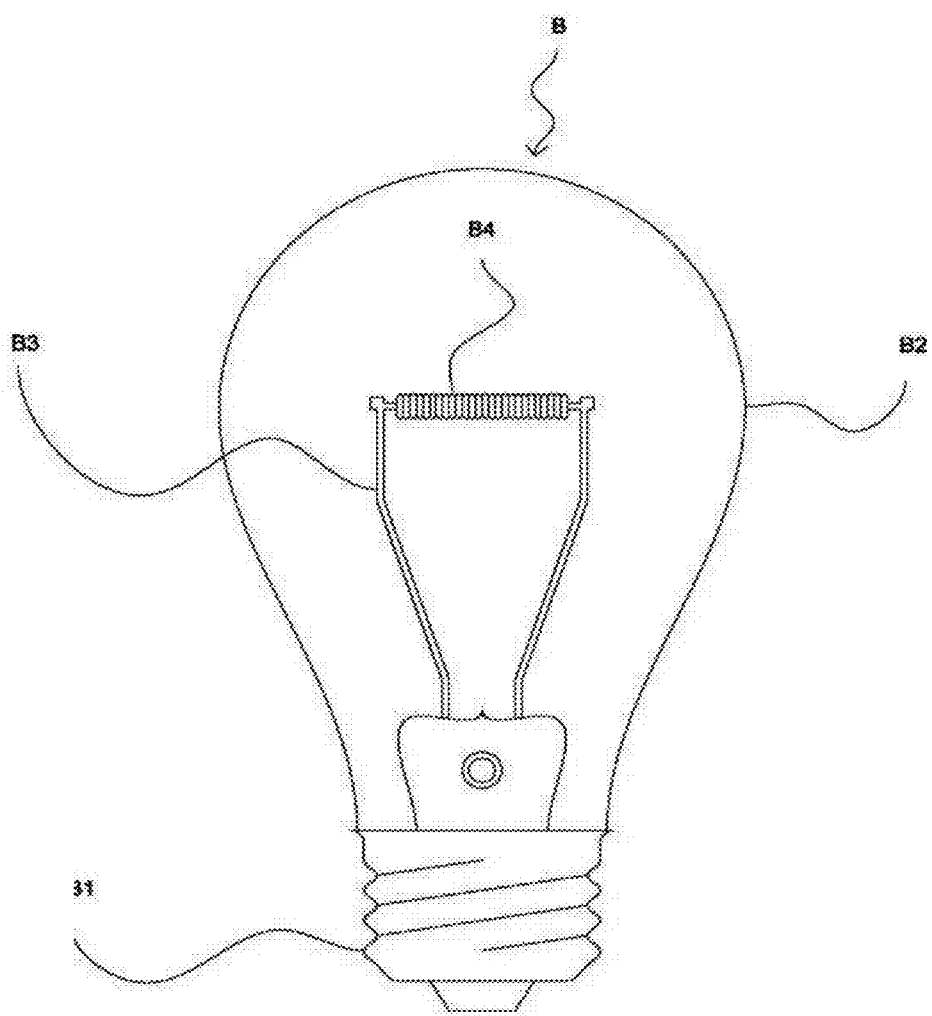
FIG. 1 is a schematic side view of a conventional incandescent light bulb.

Before the present invention is described in greater detail, it should be noted that the same or like elements are denoted by the same reference numerals throughout the disclosure. Moreover, the elements shown in the drawings are not illustrated in actual scale, but are expressly illustrated to explain in an intuitive manner the technical feature of the invention disclosed herein.

Figure 2:
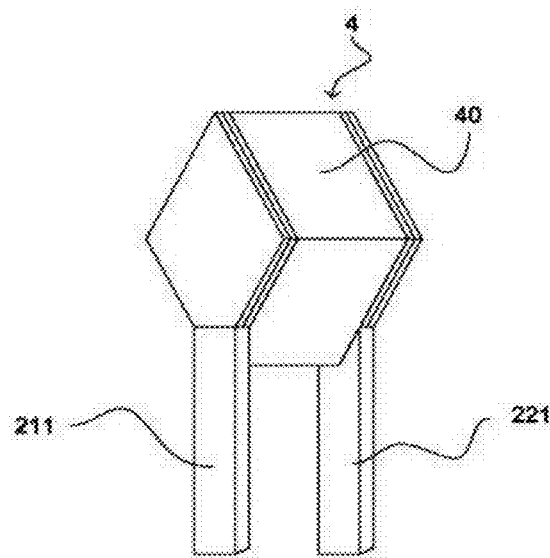
FIG. 2 is a partial schematic perspective view of a light-emitting unit in a light source package according to the first preferred embodiment of the invention.
Figure 3:
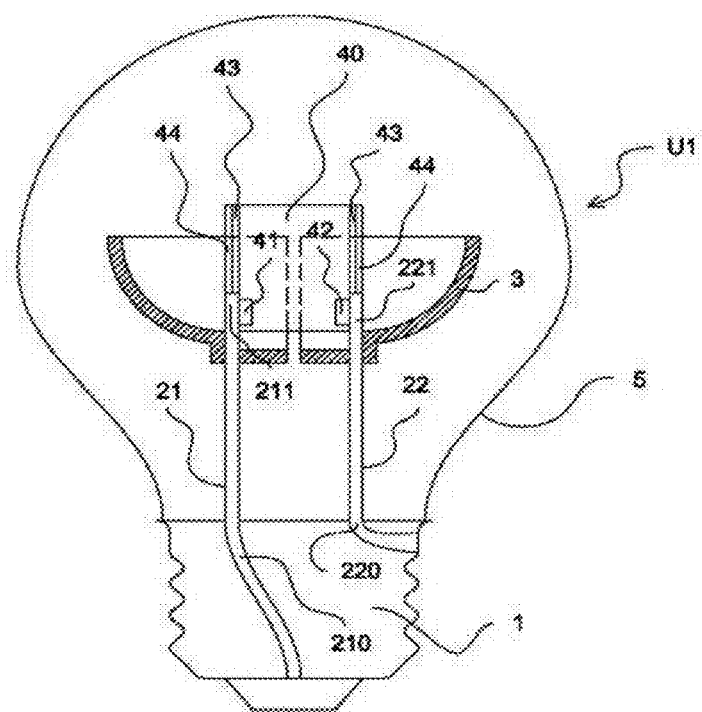
FIG. 3 is a partial schematic cross-sectional view of the light source package according to the first preferred embodiment of the invention.

FIGS. 2 and 3 are schematic diagrams illustrating a light source package U1 according to the first preferred embodiment of the invention, with FIG. 2 particularly providing a schematic perspective view of a light-emitting unit 4 that is used in the light source package U1 of FIG. 3.

Referring to FIGS. 2 and 3, the light source package U1 according to the first preferred embodiment of the invention includes a metal base 1 for engaging a socket (not shown), a light-emitting unit 4, and a transparent housing 5 assembled with the base 1 so as to form together with the base 1 an accommodating space for accommodating the light-emitting unit 4.

The base 1 is tailored to engage a socket which may be of E27, PAR 30, PAR 38, MR16 or a like type. The base 1 has a positive contact and a ground contact. According to this embodiment, the base 1 is engageable with an E27 socket and has a bottom-mounted positive contact and a negative contact provided on a side wall.

The transparent housing 5 can be made of any suitable material and is assembled with the base 1 in such a manner that the housing 5 together with the base 1 form the accommodating space.

The light-emitting unit 4 includes a pair of conductive electrodes 21 and 22, a reflective cup 3 and an LED die 40.

The conductive electrodes 21 and 22 are mounted to the base 1 in a suitable manner, with each of the conductive electrodes 21 and 22 having a first conductive terminal 210, 220 and a second conductive terminal 211, 221. The first conductive terminal 210 of the conductive electrode 21 is electrically connected to the positive contact of the base 1, whereas the first conductive terminal 220 of the conductive electrode 22 is electrically connected to the negative contact of the base 1.

The reflective cup 3 is insulatively sleeved on the pair of conductive electrodes 21, 22 at a position proximal to the second conductive terminals 211, 221 of the conductive electrodes 21, 22.

The LED die 40 has a first surface provided with a first electrode 41 and a second surface provided with a second electrode 42. The first electrode 41 and the second electrode 42 are electrically connected to the second conductive terminals 211, 221 of the conductive electrodes 21, 22, respectively, such that the LED die 40 is supported in position by the conductive electrodes 21, 22. The first surface and the second surface of the LED die 40 are each coated with a heat dissipating film 43. According to this embodiment, the heat dissipating films 43 are preferably made of material having a thermal conductivity between 800 to 1200 W/(m·K). A phosphor layer 44 is coated on the heat dissipating films 43 and the other four side surfaces of the LED die 40.

It should be noted that the LED die 40 is configured as described above such that the light emitted from all of the six surfaces of the LED die 40 can be efficiently collected for illumination, thereby enhancing the overall brightness of the light source.

Figure 4:
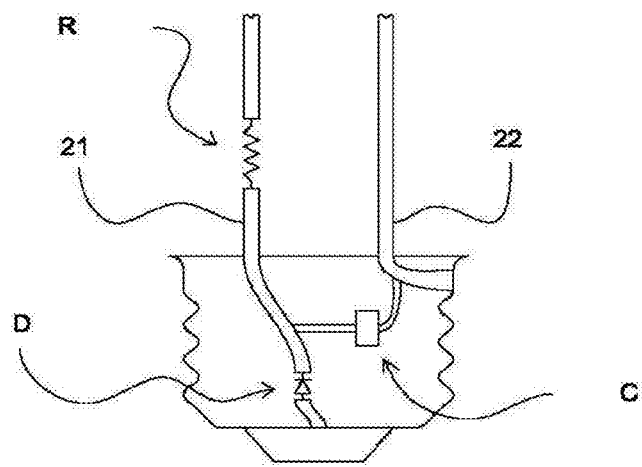
FIG. 4 is a partial schematic side view of an alternative example of the light source package according to the first preferred embodiment of the invention.

While the embodiment shown in FIG. 3 is built to take power from a direct current (DC) power source, the invention may be configured to receive power from an alternate current (AC) power source by, for example, electrically coupling a capacitor C between the conductive electrodes 21, 22 and connecting in series with the conductive electrode 21 a current limiting resistor R and a diode D, as illustrated in FIG. 4.

Figure 5:
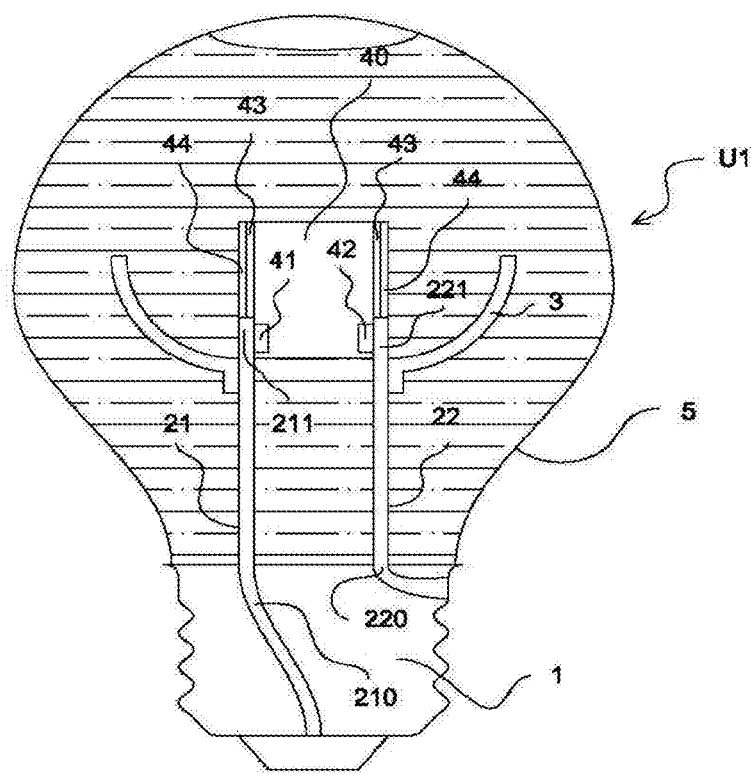
FIG. 5 is a schematic side view of an another alternative example of the light source package according to the first preferred embodiment of the invention.

On the other hand, as shown in FIG. 5, the accommodating space enclosed by the base 1 and the transparent housing 5 can be filled with a non-conductive, heat-dissipating fluid, such as a heat-dissipating oil and the like. The non-conductive, heat-dissipating fluid can be further added with a phosphor powder. Definitely, it will be readily apparent to those skilled in the art that any fluid (including gases) suitable for the heat-dissipating purpose will fall within the scope of the invention.

Figure 6:
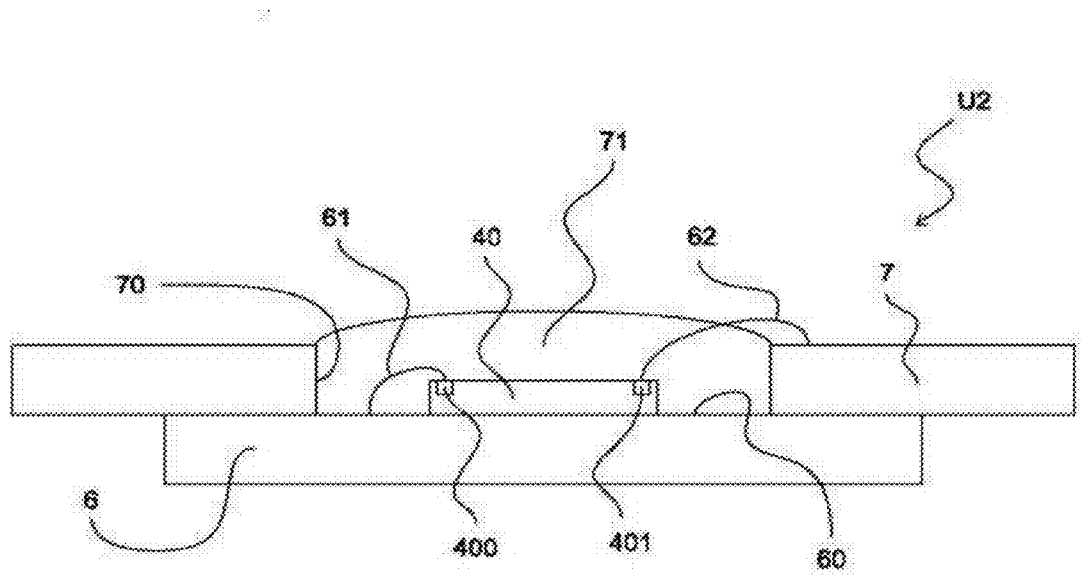
FIG. 6 is a schematic side view of a light source package according to the second preferred embodiment of the invention.

FIG. 6 shows a light source package U2 according to the second embodiment of the invention. The light source package U2 includes a mounting substrate 6, an LED die 40 and a heat pipe 7.

The mounting substrate 6 is a transparent substrate with high thermal conductivity, which has a mounting surface 60 overlaid with predetermined circuit traces (not shown).

The LED die 40 is mounted on the mounting surface 60 of the mounting substrate 6 and includes a first electrode 400 and a second electrode 401. The first electrode 400 is electrically connected to the corresponding circuit traces on the substrate 6 via a wire 61.

According to this embodiment, the heat pipe 7 has a through hole 70. The heat pipe 7 is attached onto the substrate 6, such that the LED die 40 mounted on the substrate 6 is seated within the through hole 70 of the heat pipe 7. The second electrode 401 of the LED die 40 is connected to the heat pipe 7 via a wire 62.

A transparent phosphor layer 71 is additionally formed within the through hole 70 of the heat pipe 7, so as to cover the LED die 40.

Figure 7:
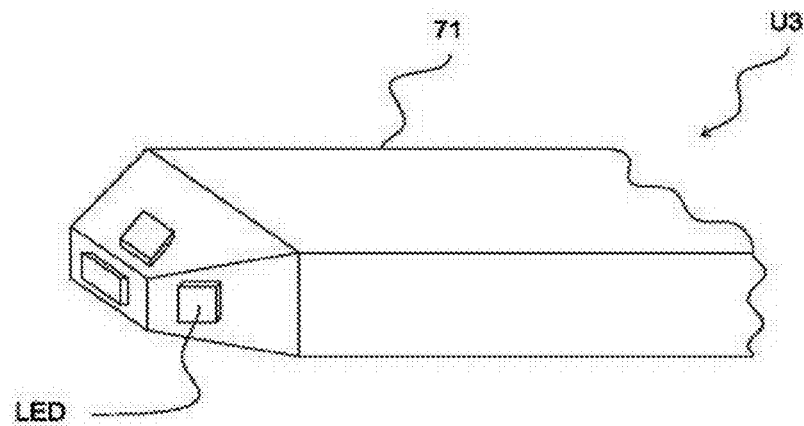
FIG. 7 is a partial schematic perspective view of a light source package according to the third preferred embodiment of the invention.

FIG. 7 shows a light source package U3 according to the third embodiment of the invention. The light source package U3 includes a heat pipe 7' and a plurality of LED dies 40. In this embodiment, the heat pipe 7' has an end portion providing five die-mounting surfaces (three of which are shown in the drawing). Each of the die-mounting surfaces is preferably flip-chip mounted with an LED die 40.

Figure 8:
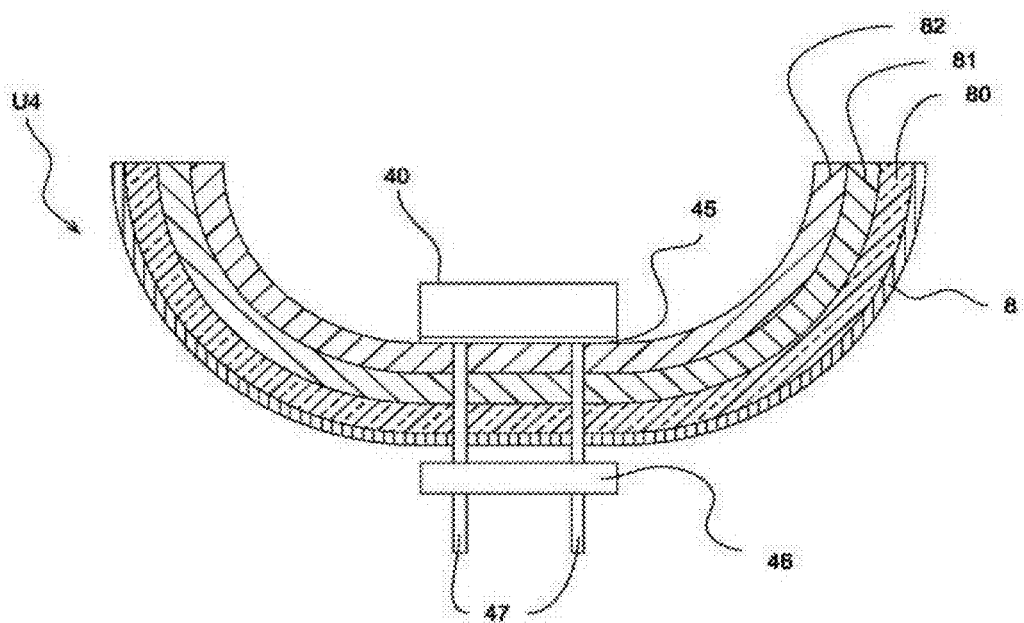
FIG. 8 is a schematic side view of a light source package according to the fourth preferred embodiment of the invention.

FIG. 8 shows a light source package U4 according to the fourth embodiment of the invention, which includes a light-emitting unit and a cup-like casing 8.

The cup-like casing 8 is made of ceramic material and has a closed bottom portion and an open top portion disposed oppositely to the bottom portion. It should be noted that the casing 8 may be alternatively made by sintering a ceramic material doped with iron (Fe) powder.

The cup-like casing 8 is formed on its inner surface with a heat-dissipating layer 80. According to this embodiment, the heat-dissipating layer 80 is preferably made by a material having a thermal conductivity between 400 W/(m·K) to 700 W/(m·K), such as a diamond film.

A thermal conductive layer 81 is coated on the heat-dissipating layer 80. According to this embodiment, the thermal conductive layer 81 is preferably made by a material having a thermal conductivity between 800 to 1200 W/(m·K), such as pyrolytic carbon.

The thermal conductive layer 81 is in turn overlaid with a reflective layer 82 which is formed by electroplating or plasma-coating a layer of metallic or non-metallic material.

It is noted that the thermal conductivity and heat-dissipating activity of the reflective cup can be enhanced by using alloy ceramics or non-alloy ceramics formed by sintering clays with metallic or non-metallic materials, such as Fe, at an elevated temperature.

The light-emitting unit includes an LED die 40, a mounting substrate 45 and a circuit device 46 for controlling power supply.

The LED die 40 is flip-chip mounted onto a die-mounting surface of the mounting substrate 45. The mounting substrate 45, on which predetermined circuit traces (not shown) are provided to electrically connect to the corresponding solder pads (not shown) provided in the LED die 40, is located at the bottom portion in an interior of the cup-like casing 8.

The mounting substrate 45 is additionally provided with a pair of conductive pins 47 which extend outwardly through the bottom portion of the casing 8. Each of the conductive pins 47 has a connecting end electrically connected to the predetermined circuit traces on the mounting substrate 45 and a free end exposed outside the bottom portion of the casing 8 and adapted for engaging a socket of an external power supplying device.

Figure 10:
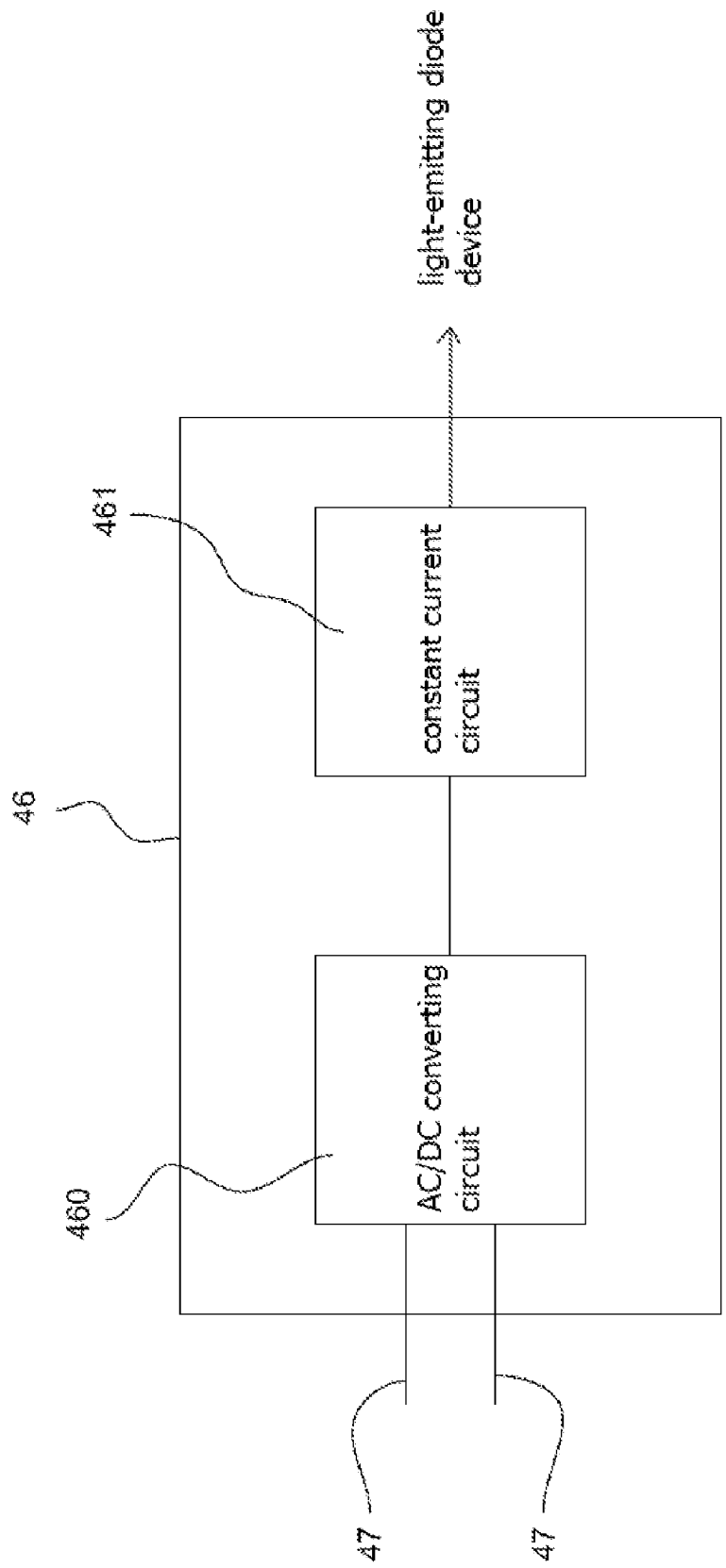
FIG. 10 is a schematic block diagram illustrating an electrical circuit useful in the invention.

The circuit device 46 for controlling power supply is located at the bottom portion on an exterior of the cup-like casing 8. The circuit device 46 for controlling power supply includes an AC/DC converting circuit 460 and a constant current circuit 461, as shown in FIG. 10.

The AC/DC converting circuit 460 has an input terminal electrically connected to the conductive pins 47. The constant current circuit 461 includes an input terminal electrically connected to an output terminal of the AC/DC converting circuit 460 and an output terminal electrically connected to the LED die 40.

Furthermore, the power supply control device can be fabricated to provide pulse width modulation (PWM) output with variable frequency, thereby reducing the power consumption up to 20% and decreasing more than 30% of the heat generation from the LED die.

The power supply control device may also be provided with protective functions against overheat, over-current and over-voltage, the details of which are readily apparent to those skilled in the art and need not to be described herein.

Figure 9:
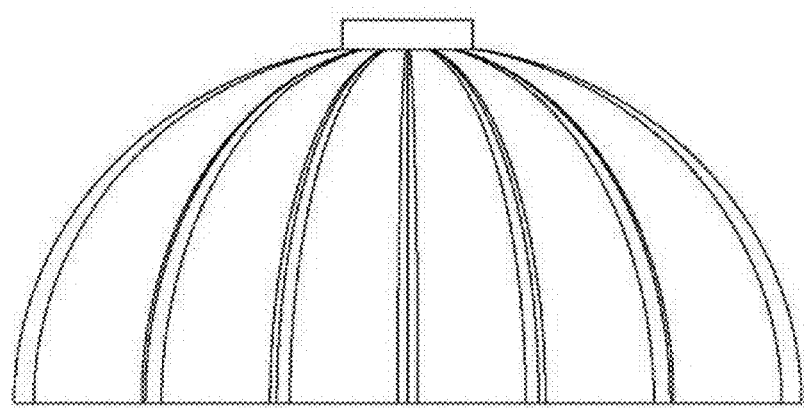
FIG. 9 is a schematic side view of an alternative example of the light source package according to the fourth preferred embodiment of the invention.

FIG. 9 shows an alternative example of the embodiment of FIG. 8. The device of FIG. 9 differs from that shown in FIG. 8 in that the reflective cup thereof is provided on its outer surface with a plurality of ribs 83 extending in radial directions. The ribs 83 are preferably made by sintering a metallic material of high thermal conductivity with or without a ceramic material.

The ribs 83 may be further distributed on their surfaces with heat dissipating powder, so as to synergistically enhance both the thermal conductivity and heat dissipating activity.

In conclusion, the light source package disclosed herein can surely achieve the intended objects and effects of the invention by virtue of the structural arrangements described above.

While the invention has been described with reference to the preferred embodiments above, it should be recognized that the preferred embodiments are given for the purpose of illustration only and are not intended to limit the scope of the present invention and that various modifications and changes, which will be apparent to those skilled in the relevant art, maybe made without departing from the spirit of the invention and the scope thereof as defined in the appended claims.

What is claimed is:

1. A light source package, comprising:
a metal base adapted for engaging an electrical socket;
a transparent housing assembled with the base so as to form together with the base an accommodating space; and
a light-emitting unit mounted within the accommodating space and comprising a light-emitting diode die, the light-emitting diode die having six light-emitting surfaces and being operatively disposed in the accommodating space such that the light emitted from all of the six surfaces of the light-emitting diode die is completely collected for illumination,
wherein the light-emitting unit further comprises:
a pair of conductive electrodes mounted on the base, each having a first conductive terminal and a second conductive terminal, wherein the first conductive terminal of one of the conductive electrodes is electrically connected to a positive contact of the base, whereas the first conductive terminal of the other conductive electrode is electrically connected to a negative contact of the base; and
a reflective cup insulatively sleeved on the pair of conductive electrodes
wherein the light-emitting diode die has a first surface, among the six light-emitting surfaces, provided with a first electrode and a second surface, among the six light-emitting surfaces, provided with a second electrode, wherein the first electrode and the second electrode are electrically connected to the second conductive terminals of the conductive electrodes, respectively, such that the light-emitting diode die is supported in position by the conductive electrodes.

2. The light source package according to claim 1, wherein the first surface and the second surface of the light-emitting diode die are each coated with a heat dissipating film.

3. The light source package according to claim 2, wherein the heat dissipating films are made of material having a thermal conductivity between 800 to 1200 W/(m·K).

4. The light source package according to claim 2, wherein a phosphor layer is coated on the heat dissipating films and four side surfaces of the light-emitting diode die.

5. The light source package according to claim 1, further comprising a capacitor electrically coupled between the conductive electrodes and a current limiting resistor and a diode connected in series with one of the conductive electrodes, such that the base is enabled to directly engage a socket of and receive power from an alternate current power source.

6. The light source package according to claim 1, further comprising a non-conductive, heat-dissipating fluid filled within the accommodating space.

7. The light source package according to claim 6, wherein the non-conductive, heat-dissipating fluid is selected from the group consisting of heat-dissipating oils, pure water and gases suitable for the heat-dissipating purpose.

8. The light source package according to claim 1, wherein the reflective cup is insulatively sleeved on the pair of conductive electrodes at a position proximal to the second conductive terminals of the conductive electrodes.

* * * * *